(12) United States Patent
Nakamura

(10) Patent No.: US 8,878,232 B2
(45) Date of Patent: Nov. 4, 2014

(54) METHOD FOR PRODUCING GROUP III NITRIDE SEMICONDUCTOR LIGHT-EMITTING DEVICE

(75) Inventor: Ryo Nakamura, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 59 days.

(21) Appl. No.: 13/527,458

(22) Filed: Jun. 19, 2012

(65) Prior Publication Data

US 2012/0326205 A1 Dec. 27, 2012

(30) Foreign Application Priority Data

Jun. 23, 2011 (JP) ................................ 2011-139869

(51) Int. Cl.
H01L 33/00 (2010.01)
H01L 33/32 (2010.01)
H01L 21/02 (2006.01)
H01L 33/08 (2010.01)

(52) U.S. Cl.
CPC .......... *H01L 21/02507* (2013.01); *H01L 33/32* (2013.01); *H01L 21/02458* (2013.01); *H01L 21/0254* (2013.01); *H01L 21/0262* (2013.01); *H01L 33/007* (2013.01); *H01L 33/08* (2013.01)
USPC ................. 257/103; 257/13; 257/14; 257/17; 257/79; 257/89; 257/94

(58) Field of Classification Search
CPC ............ H01L 33/502; H01L 21/02458; H01L 21/0254; H01L 33/04; H01L 33/06; H01L 33/32; H01L 33/08; H01L 33/007; H01L 21/0262

USPC ...................... 257/103, 13, 14, 17, 79, 89, 94
See application file for complete search history.

(56) References Cited

U.S. PATENT DOCUMENTS

| 6,399,963 | B2 * | 6/2002 | Sugawara et al. ............... 257/96 |
| 6,423,984 | B1 | 7/2002 | Kato et al. |
| 6,853,009 | B2 | 2/2005 | Kato et al. |
| 7,045,809 | B2 | 5/2006 | Kato et al. |
| 7,067,838 | B1 | 6/2006 | Sato et al. |
| 7,372,066 | B2 * | 5/2008 | Sato et al. ........................ 257/14 |

(Continued)

FOREIGN PATENT DOCUMENTS

| JP | 2000-091629 A | 3/2000 |
| JP | 2006-332365 A | 12/2006 |
| WO | WO 2005/101532 A1 | 10/2005 |

OTHER PUBLICATIONS

Japanese Office Action dated Dec. 24, 2013, with partial English translation.

*Primary Examiner* — Fernando L Toledo
*Assistant Examiner* — Mohammed Shamsuzzaman
(74) *Attorney, Agent, or Firm* — McGinn IP Law Group, PLLC

(57) ABSTRACT

An MQW-structure light-emitting layer is formed by alternately stacking InGaN well layers and AlGaN barrier layers. Each well layer and each barrier layer are formed so as to satisfy the following relations: $12.9 \le -2.8x+100y \le 37$ and $0.65 \le y \le 0.86$, or to satisfy the following relations: $162.9 \le 7.1x+10z \le 216.1$ and $3.1 \le z \le 9.2$, here x represents the Al compositional ratio (mol %) of the barrier layer, and y represents the difference in bandgap energy (eV) between the barrier layer and the well layer, and z represents the In compositional ratio (mol %) of the well layer.

15 Claims, 3 Drawing Sheets

(56) References Cited

U.S. PATENT DOCUMENTS

| | | |
|---|---|---|
| 2001/0030318 A1* | 10/2001 | Nakamura et al. ............ 257/13 |
| 2002/0149024 A1 | 10/2002 | Kato et al. |
| 2004/0026705 A1* | 2/2004 | Kato et al. .................... 257/94 |
| 2006/0131558 A1* | 6/2006 | Sato et al. .................... 257/17 |
| 2006/0175600 A1* | 8/2006 | Sato et al. .................... 257/14 |
| 2006/0273324 A1* | 12/2006 | Asai et al. .................... 257/79 |
| 2008/0149917 A1* | 6/2008 | Park ............................. 257/17 |
| 2008/0210958 A1* | 9/2008 | Senda et al. .................. 257/89 |
| 2011/0227033 A1* | 9/2011 | Kushibe et al. ............... 257/13 |
| 2012/0217471 A1* | 8/2012 | Shioda et al. ................. 257/13 |

* cited by examiner

METHOD FOR PRODUCING GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device, and more particularly to a production method whose characteristic feature resides in a process for forming an MQW layer.

2. Background Art

As has been hitherto known, a Group III nitride semiconductor light-emitting device includes a light-emitting layer having an MQW structure in which InGaN well layers and AlGaN barrier layers are alternately stacked in a repeated manner.

Patent Document 1 discloses a Group III nitride semiconductor light-emitting device including an MQW-structure layer in which well layers and barrier layers are alternately stacked in a repeated manner, wherein the barrier layers are formed from $Al_xGa_{1-x}N$ having an Al compositional ratio x of 3 mol % to 6 mol %. This patent document also describes that the device has an emission wavelength of 460 nm to 470 nm. However, the patent document does not refer to the relationship between the Al compositional ratio of the barrier layers and the emission wavelength of the device.

Patent Document 2 discloses a semiconductor light-emitting device including an MQW-structure layer in which well layers and barrier layers are alternately stacked in a repeated manner, wherein the well layers are formed from $In_yGa_{1-y}N$ having an In compositional ratio y of 5 mol %, and the barrier layers are formed from $Al_xGa_{1-x}N$ having an Al compositional ratio x of 13 mol %. This patent document describes that the Al compositional ratio x of the barrier layers is desirably 6 mol % to 18 mol %, but does not particularly describe the emission wavelength of the device.

Patent Document 1: Japanese Patent Application Laid-Open (kokai) No. 2006-332365
Patent Document 2: Japanese Patent Application Laid-Open (kokai) No. 2000-91629

However, in the case where a barrier layer of an MQW-structure layer is formed from $Al_xGa_{1-x}N$, when the Al compositional ratio x of the barrier layer is high, carrier injection performance is lowered, whereas when the Al compositional ratio x of the barrier layer is low, carrier confinement performance is lowered, which results in low output of a light-emitting device. Therefore, in order to improve the output of the light-emitting device without impairing the function of the barrier layer, the Al compositional ratio x of the barrier layer must be determined according to the emission wavelength of the device. In each of the light-emitting devices disclosed in Patent Documents 1 and 2, the Al compositional ratio x of the barrier layer is not optimized in association with the emission wavelength of the device.

SUMMARY OF THE INVENTION

In view of the foregoing, an object of the present invention is to provide a light-emitting device whose emission performance is improved by optimizing the Al compositional ratio of a barrier layer of an MQW-structure layer according to emission wavelength.

In a first aspect of the present invention, there is provided a method for producing a Group III nitride semiconductor light-emitting device comprising an MQW-structure light-emitting layer in which well layers, each being formed from an In-containing Group III nitride semiconductor, and barrier layers, each being formed from an Al-containing Group III nitride semiconductor and having a bandgap energy greater than that of the well layer, are alternately stacked in a repeated manner, the method comprising:

forming a well layer and a barrier layer so as to satisfy the following relations: $12.9 \leq -2.8x+100y \leq 37$ and $0.65 \leq y \leq 0.86$, here x represents the Al compositional ratio (mol %) of the barrier layer which is defined as a ratio of the number of moles of Al to the number of moles of total Group III atoms of the barrier layer, and y represents the difference in bandgap energy (eV) between the barrier layer and the well layer.

In a second aspect of the present invention, there is provided a method for producing a Group III nitride semiconductor light-emitting device comprising an MQW-structure light-emitting layer in which well layers, each being formed from an In-containing Group III nitride semiconductor, and barrier layers, each being formed from an Al-containing Group III nitride semiconductor and having a bandgap energy greater than that of the well layer, are alternately stacked in a repeated manner, the method comprising:

forming a well layer and a barrier layer so as to satisfy the following relations: $162.9 \leq 7.1x+10z \leq 216.1$ and $3.1 \leq z \leq 9.2$, here x represents the Al compositional ratio (mol %) of the barrier layer which is defined as a ratio of the number of moles of Al to the number of moles of total Group III atoms of the barrier layer, and z represents the In compositional ratio (mol %) of the well layer which is defined as a ratio of the number of moles of In to the number of moles of total Group III atoms of the well layer.

In the first and second aspects, "Group III nitride semiconductor" encompasses a compound semiconductor represented by the formula $Al_xGa_yIn_zN$ ($x+y+z=1$, $0 \leq x, y, z \leq 1$); such a semiconductor in which Al, Ga, or In is partially substituted by another Group 13 element (i.e., B or Tl), or N is partially substituted by another Group 15 element (i.e., P, As, Sb, or Bi). Generally, Si is used as an n-type impurity, and Mg is used as a p-type impurity. Specific examples of the Group III nitride semiconductor include those containing at least Ga, such as GaN, InGaN, AlGaN, and AlGaInN.

A capping layer may be formed between the well layer and the barrier layer at the same growth temperature as employed for the well layer. When such a capping layer is provided, emission performance can be improved, since the capping layer prevents release of In from the well layer during heating for formation of the barrier layer. Particularly preferably, there is provided a capping layer having an Al compositional ratio which is more than zero and is equal to or lower than that of the barrier layer. In this case, since recombination of carriers can be suppressed in the capping layer, emission performance can be further improved. Preferably, a capping layer having a thickness of one to eight monolayer(s) (or monomolecular layer(s)) is provided. When a capping layer having such a thickness is provided, the dependence of emission performance on the thickness of the capping layer is reduced, and reproducibility, productivity, and yield can be further improved.

The number of MQW structure units, each consisting of a well layer and a barrier layer, is preferably 3 to 10. This is because when the number is less than 3, the MQW structure may fail to exhibit a sufficient effect of improving emission performance, whereas when the number exceeds 10, emission performance may be impaired.

The well layer may be formed from $In_{z'}Ga_{1-z'}N$, here $0<z' \leq 1$, and the barrier layer may be formed from $Al_{x'}Ga_{1-x'}N$, here $0<x' \leq 1$. The barrier layer may be formed of a single layer or a plurality of layers.

A third aspect of the present invention is drawn to a specific embodiment of the method for producing a Group III nitride semiconductor light-emitting device according to the first or second aspect, wherein the light-emitting device has an emission wavelength of 380 nm to 410 nm.

A fourth aspect of the present invention is drawn to a specific embodiment of the method for producing a Group III nitride semiconductor light-emitting device according to any of the first to third aspects, wherein the well layer is formed from $In_zGa_{1-z}N$, here $0<z'\leq 1$, and the barrier layer is formed from $Al_xGa_{1-x}N$, here $0<x'\leq 1$.

According to the present invention, the Al compositional ratio of a barrier layer forming an MQW structure can be optimized according to emission wavelength, and thus carrier injection performance and carrier confinement performance can be optimized. Therefore, the resultant Group III nitride semiconductor light-emitting device exhibits improved emission performance. Particularly, the present invention is suitable for a Group III nitride semiconductor light-emitting device having an emission wavelength of 380 nm to 410 nm. Hitherto, a Group III nitride semiconductor light-emitting device having such an emission wavelength has exhibited poor emission performance. However, the present invention can effectively improve the emission performance of such a light-emitting device.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
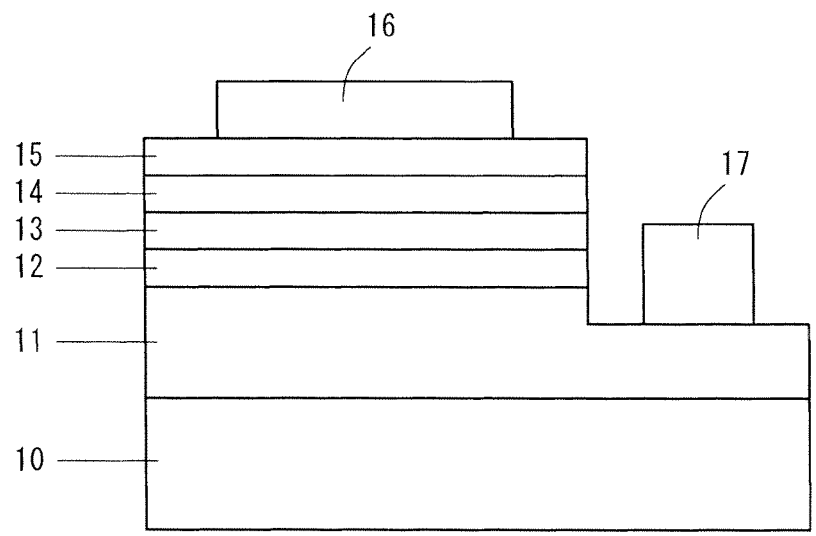
FIG. 1 shows the configuration of a Group III nitride semiconductor light-emitting device according to Embodiment 1.

FIG. 1 shows the configuration of a Group III nitride semiconductor light-emitting device according to Embodiment 1. The Group III nitride semiconductor light-emitting device according to Embodiment 1 includes a sapphire substrate 10; an n-type contact layer 11 formed from n-GaN; an n-type cladding layer 12 having a superlattice structure in which i-GaN layers and i-InGaN layers are alternately formed in a repeated manner; a light-emitting layer 13 having an MQW structure; a p-type cladding layer 14 having a superlattice structure in which p-InGaN layers and p-AlGaN layers are alternately formed in a repeated manner; and a p-type contact layer 15 formed from p-GaN, the layers 11 to 15 being sequentially stacked on the substrate 10. A p-electrode 16 is formed on the p-type contact layer 15. Portions of the layers 12 to 15 are removed through etching from the top surface of the p-type contact layer 15 to the n-type contact layer 11, and the corresponding portion of the surface of the n-type layer 11 is exposed. An n-electrode 17 is formed on the exposed portion of the surface of the n-type contact layer 11. An ESD layer formed from i-GaN and n-GaN may be provided between the n-type contact layer 11 and the n-type cladding layer 12 for improving electrostatic breakdown voltage. The p-type contact layer 15 may be formed of a plurality of layers having different Mg concentrations for achieving good contact between the layer 15 and the p-electrode 16. Similarly, the n-type contact layer 11 may be formed of a plurality of layers having different Si concentrations for achieving good contact between the layer 11 and the n-electrode 17.

The sapphire substrate 10 may be replaced with a substrate formed from, for example, SiC, Si, ZnO, spinel, or GaN. The substrate may have, for example, a stripe-pattern or dot-pattern embossment.

Figure 2:
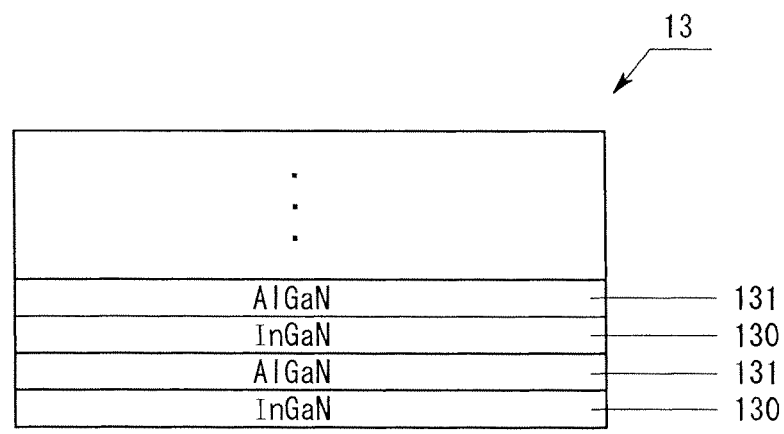
FIG. 2 shows the configuration of a light-emitting layer 13.

As shown in FIG. 2, the light-emitting layer 13 has an MQW structure including eight layer units, each consisting of an $In_zGa_{1-z}N$ well layer 130 and an $Al_xGa_{1-x}N$ barrier layer 131. Each well layer 130 has a thickness of 3 nm, and each barrier layer 131 has a thickness of 2 nm to 3 nm.

The number of MQW structure units is not limited to eight, but is preferably 3 to 10. This is because when the number is less than 3, the MQW structure may fail to exhibit a sufficient effect of improving emission performance, whereas when the number exceeds 10, emission performance may be impaired. The number of MQW structure units is more preferably 8 to 10. The thicknesses of each well layer 130 and each barrier layer 131 are not limited to the aforementioned respective ranges, but the thicknesses of each well layer 130 and each barrier layer 131 are preferably adjusted to 2 nm to 4 nm and 2 nm to 8 nm, respectively. When the thicknesses of these layers fall within the above ranges, emission performance can be effectively improved. More preferably, the thicknesses of each well layer 130 and each barrier layer 131 are adjusted to 3 nm to 4 nm and 2 nm to 4 nm, respectively.

A capping layer may be formed between the well layer 130 and the barrier layer 131 at the same growth temperature as employed for the well layer 130. When such a capping layer is provided, emission performance can be improved, since the capping layer prevents release of In from the well layer 130 during heating for formation of the barrier layer 131. Particularly preferably, there is provided a capping layer having an Al compositional ratio which is more than zero and is equal to or lower than that of the barrier layer 131. In this case, since recombination of carriers can be suppressed in the capping layer, emission performance can be further improved. Most preferably, the Al compositional ratio of the capping layer is equal to that of the barrier layer 131. The capping layer preferably has a thickness of one to eight monolayer(s) (or monomolecular layer(s), hereinafter the term of monolayer(s) is used). The thickness of one monolayer corresponds to ½ of the c-axis lattice constant of a Group III nitride semiconductor (e.g., about 2.59 Å when the Group III nitride semiconductor is GaN). When the thickness of the capping layer falls within a range of one to eight monolayer(s), the dependence of emission performance on the thickness of the capping layer is reduced, and reproducibility, productivity, and yield can be further improved. The capping layer may be formed of a plurality of layers.

When the light-emitting device is of a face-up type, the p-electrode 16 consists of, for example, an ITO electrode formed on almost the entire top surface of the p-type contact layer 15 and an Ni/Au wiring electrode formed on the ITO electrode. When the light-emitting device is of a flip-chip type, the p-electrode 16 is formed from a highly reflective metallic material such as Ag or Rh. The n-electrode 17 is formed from, for example, Ti/Al.

Next will be described processes for producing the Group III nitride semiconductor light-emitting device according to Embodiment 1.

Figure 3A:
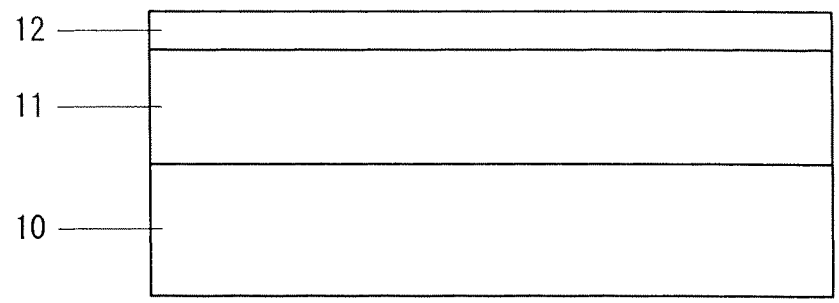
FIGS. 3A to 3C are sketches showing processes for producing the Group III nitride semiconductor light-emitting device according to Embodiment 1.

Firstly, a sapphire substrate 10 is heated in a hydrogen atmosphere for thermal cleaning. Subsequently, an n-type contact layer 11 and an n-type cladding layer 12 are sequentially formed on the sapphire substrate 10 through MOCVD via a buffer layer (not illustrated) (FIG. 3A). Hydrogen and nitrogen are employed as carrier gases. Ammonia is employed as a nitrogen source; TMG (trimethylgallium) is employed as a Ga source; TMA (trimethylaluminum) is employed as an Al source; and $SiH_4$ (silane) is employed as a doping gas.

Figure 3B:
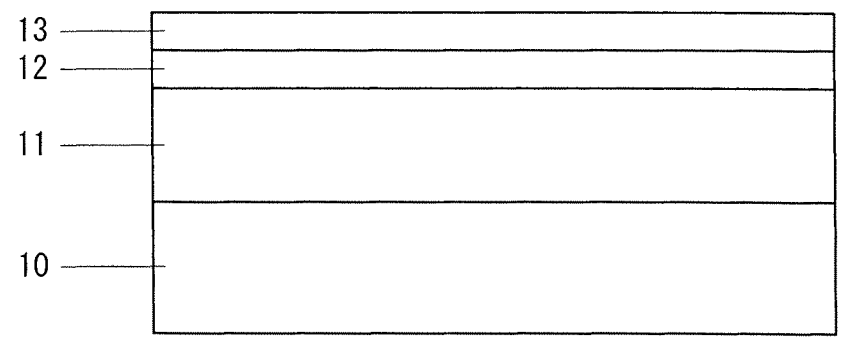

Next, there are carried out a process for forming an $In_zGa_{1-z}N$ well layer 130 (thickness: 3 nm) at a growth temperature of 750° C. to 850° C., and a process for forming an $Al_xGa_{1-x}N$ barrier layer 131 (thickness: 2 nm to 3 nm) on the well layer 130 at a growth temperature of 850° C. to 950° C. These processes are sequentially carried out in a repeated manner (each process is performed eight times), to thereby form an MQW-structure light-emitting layer 13 on the n-type cladding layer 12 (FIG. 3B). Each of the well layer 130 and the barrier layer 131 is formed by MOCVD. TMI (trimethylindium) is employed as an In source. Carrier gases and other raw material gases are the same as those employed for forming the n-type contact layer 11 and the n-type cladding layer 12.

The $In_zGa_{1-z}N$ well layer 130 and the $Al_xGa_{1-x}N$ barrier layer 131 are formed so as to satisfy the following relations: $12.9 \leq -2.8x+100y \leq 37$ and $0.65 \leq y \leq 0.86$, here x=100x', x represents the Al compositional ratio (mol %) of the barrier layer which is defined as a ratio of the number of moles of Al to the number of moles of total Group III atoms, i.e., Al and Ga, of the barrier layer, and y represents the difference in bandgap energy (eV) between the barrier layer and the well layer.

Or the $In_zGa_{1-z}N$ well layer 130 and the $Al_xGa_{1-x}N$ barrier layer 131 are formed so as to satisfy the following relations: $162.9 \leq 7.1x+10z \leq 216.1$ and $3.1 \leq z \leq 9.2$, here X=100x', Z=100Z', x represents the Al compositional ratio (mol %) of the barrier layer which is defined as a ratio of the number of moles of Al to the number of moles of total Group III atoms, i.e., Al and Ga, of the barrier layer, and z represents the In compositional ratio (mol %) of the well layer which is defined as a ratio of the number of moles of In to the number of moles of total Group III atoms, i.e., In and Ga, of the well layer.

When these layers are formed so as to satisfy the aforementioned relations, the resultant light-emitting device has an emission wavelength of 380 nm to 410 nm.

Figure 3C:
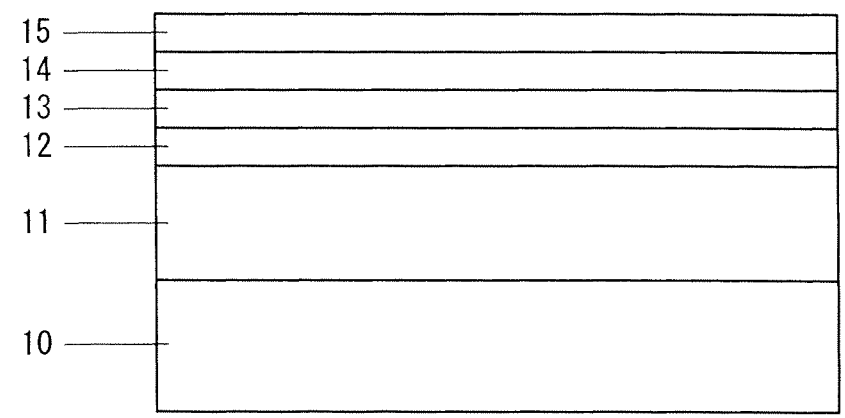

Subsequently, a p-type cladding layer 14 and a p-type contact layer 15 are sequentially formed on the light-emitting layer 13 (FIG. 3C). TMI (trimethylindium) is employed as an In source, and $Cp_2Mg$ (biscyclopentadienylmagnesium) is employed as a p-type dopant source. Carrier gases and other raw material gases are the same as those employed for forming, for example, the n-type contact layer 11.

Next, Mg is activated through thermal treatment, and then dry etching is carried out from the side of the top surface of the p-type contact layer 15, to thereby form a groove reaching the n-type contact layer 11. Thereafter, a p-electrode 16 is formed on the p-type contact layer 15, and an n-electrode 17 is formed on the n-type contact layer 11 exposed through the bottom of the groove provided by dry etching. Thus, the Group III nitride semiconductor light-emitting device shown in FIG. 1 is produced.

Figure 4:
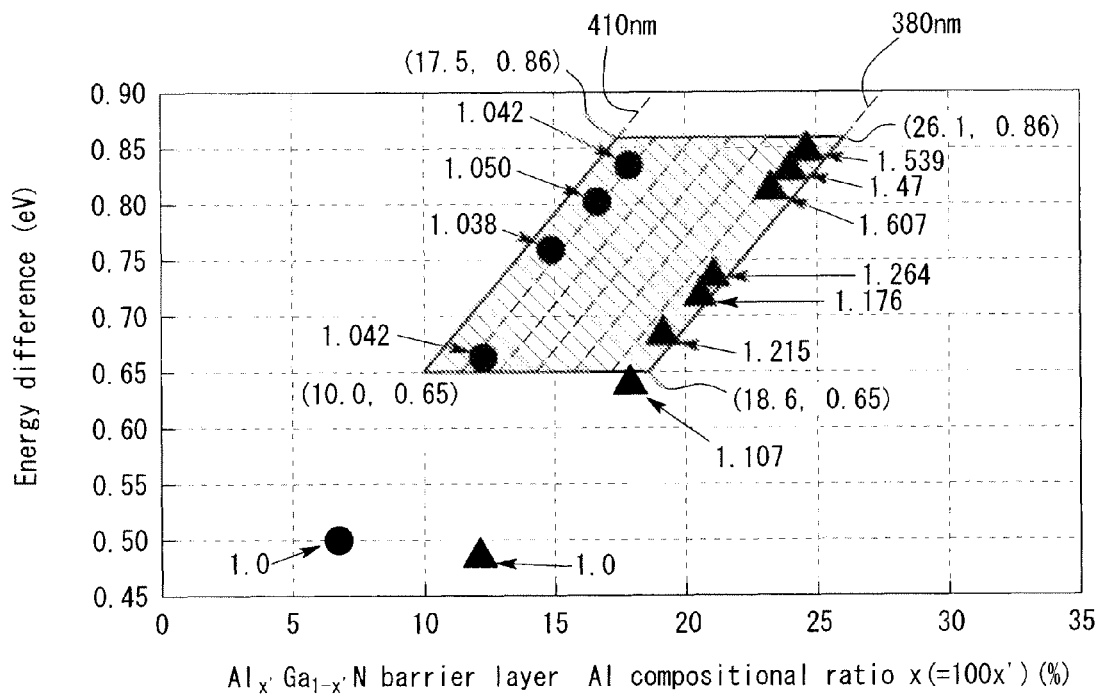
FIG. 4 shows the relationship between bandgap energy difference and the Al compositional ratio of a barrier layer 131.

Next will be described the reason why the well layer 130 and the barrier layer 131 are formed so as to satisfy the aforementioned relations. FIG. 4 is a graph showing the relationship between bandgap energy difference (unit: eV) and the Al compositional ratio x (unit: mol %) of the barrier layer 131 in a Group III nitride semiconductor light-emitting device having the same configuration as the Group III nitride semiconductor light-emitting device according to Embodiment 1. As used herein, "bandgap energy difference" refers to the difference in bandgap energy between the barrier layer 131 and the well layer 130. This bandgap energy difference corresponds to the sum of the barrier height of the barrier layer against electrons and the barrier height thereof against holes. In FIG. 4, each dotted diagonal line or each solid diagonal line corresponds to a constant same emission wavelength. The interval between adjacent diagonal lines corresponds to a wavelength of 5 nm. Specifically, the leftmost diagonal line (i.e., on the side of low Al compositional ratio x) corresponds to an emission wavelength of 410 nm, and the rightmost diagonal line corresponds to an emission wavelength of 380 nm. In FIG. 4, triangular plots correspond to the case where the Al compositional ratio x of the barrier layer is varied in a Group III nitride semiconductor light-emitting device having an emission wavelength of 380 nm to 385 nm. Meanwhile, circular plots correspond to the case where the Al compositional ratio x of the barrier layer is varied in a Group III nitride semiconductor light-emitting device having an emission wavelength of 400 nm to 410 nm. The numerical value of each plot marked with an arrow represents the relative output at the corresponding Al compositional ratio x.

For calculation of bandgap energy difference, the bandgap energy of the well layer 130 was determined by the formula $\lambda=1240/\Delta E$ ($\lambda$: emission wavelength, $\Delta E$: bandgap energy), and the bandgap energy of the barrier layer 131 was determined using Vegard's law on the basis of the following values (bandgap energy of GaN: 3.39 eV, bandgap energy of AlN: 6.2 eV, and bandgap energy of InN: 0.65 eV).

As is clear from FIG. 4, the optimal Al compositional ratio x of the barrier layer 131 varies with emission wavelength. As shown in FIG. 4, improvement of emission performance is achieved when bandgap energy difference falls within a range of 0.65 to 0.86, and the Al compositional ratio x(=100x') falls within a range between the diagonal lines corresponding to 380 nm and 410 nm. Specifically, improvement of emission performance is achieved when the $In_zGa_{1-z}N$ well layer 130 and the $Al_xGa_{1-x}N$ barrier layer 131 are formed so as to satisfy the following relations: $12.9 \leq -2.8x+100y \leq 37$ and $0.65 \leq y \leq 0.86$ (wherein x represents the Al compositional ratio (mol %) of the barrier layer 131, and y represents the difference in bandgap energy (eV) between the barrier layer 131 and the well layer 130), the relations corresponding to the inner region of a parallelogram defined by the vertex coordinates (10.0, 0.65), (18.6, 0.65), (26.1, 0.86), and (17.5, 0.86). When the Al compositional ratio x of the barrier layer 131 is adjusted according to emission wavelength so that the Al compositional ratio x and the bandgap energy difference satisfy the aforementioned relations, the resultant Group III nitride semiconductor light-emitting device exhibits high emission performance.

Figure 5:
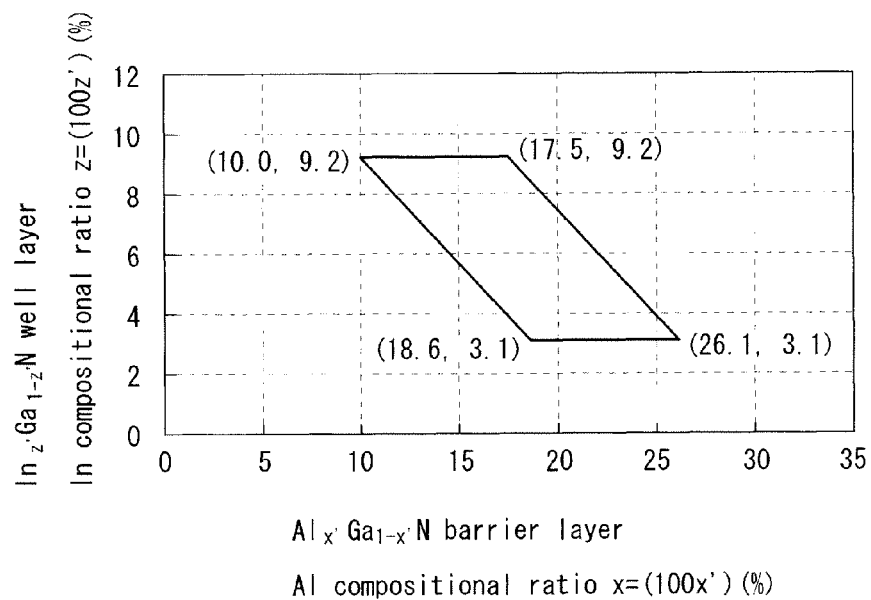
FIG. 5 shows the ranges of the In compositional ratio of a well layer 130 and the Al compositional ratio of the barrier layer 131.

FIG. 5 is a graph corresponding to the aforementioned region shown in FIG. 4, the graph being prepared by converting the bandgap energy difference to the In compositional ratio z(=100z') of the $In_zGa_{1-z}N$ well layer 130 (unit: mol %). The diagonal line at 380 nm in FIG. 4 corresponds to the case where the In compositional ratio z of the well layer 130 is 9.2 mol %, and the diagonal line at 410 nm in FIG. 4 corresponds to the case where the In compositional ratio z of the well layer 130 is 3.1 mol %. Therefore, the aforementioned region corresponds to the case where the $In_zGa_{1-z}N$ well layer 130 and the $Al_xGa_{1-x}N$ barrier layer 131 are formed so as to satisfy the following relations: $162.9 \leq 7.1x+10z \leq 216.1$ and $3.1 \leq z \leq 9.2$ (wherein x represents the Al compositional ratio x(mol %) of the barrier layer, $x=100x'$, and z represents the In compositional ratio z(mol %) of the well layer, $z=100z'$), the relations corresponding to the inner region of a parallelogram defined by the vertex coordinates (18.6, 3.1), (26.1, 3.1), (17.5, 9.2), and (10.0, 9.2) in FIG. 5. When the Al compositional ratio x of the barrier layer 131 is adjusted according to emission wavelength so that the Al compositional ratio x and the In compositional ratio z satisfy the aforementioned relations, the resultant Group III nitride semiconductor light-emitting device exhibits high emission performance.

A characteristic feature of the present invention resides in a process for forming a light-emitting layer of a Group III nitride semiconductor light-emitting device. Therefore, the entire Group III nitride semiconductor light-emitting device (exclusive of the light-emitting layer) may have the same structure as any of hitherto known various light-emitting devices, and may be produced by any known conventional production method. For example, the present invention is also applicable to a light-emitting device having a structure in which a substrate is formed of, for example, an electrically conductive material, and electrodes are provided above and below the substrate so as to establish conduction in a direction perpendicular to the substrate.

The Group III nitride semiconductor light-emitting device produced by the method of the present invention can be employed in, for example, an illumination apparatus.

What is claimed is:

1. A method for producing a Group III nitride semiconductor light-emitting device comprising an MQW-structure light-emitting layer in which well layers, each comprising InGaN semiconductor, and barrier layers, each comprising AlGaN semiconductor and having a bandgap energy greater than that of the well layers, are alternately stacked in a repeated manner, the method comprising:
    forming a well layer at a first temperature from 750° C. to 850° C., and forming a barrier layer at a second temperature from 850° C. to 950° C. which is higher than the first temperature; and
    forming a capping layer of AlGaN having an Al compositional ratio, which is equal to or lower than that of the barrier layer is formed, on the well layer at the first temperature,
    wherein a straight line $-2.8x+100y=D(\lambda)$ is determined according to an emission wavelength $\lambda$, y is determined within a range of $0.65 \leq y \leq 0.86$, x is obtained by substituting the determined y value for y in the equation of $-2.8x+100y=D(\lambda)$, and an In compositional ratio (mol %) of the well layer is determined from the x and y values so as to satisfy the following relations: $12.9 \leq -2.8x+100y \leq 37$ and $0.65 \leq y \leq 0.86$, here x represents the Al compositional ratio (mol %) of the barrier layer which is defined as a ratio of a number of moles of Al to a number of moles of total Group III atoms of the barrier layer, and y represents a difference in bandgap energy (eV) between the barrier layer and the well layer, and
    wherein a thickness of the capping layer falls within a range from 1 monolayer to 8 monolayers.

2. A method for producing a Group III nitride semiconductor light-emitting device according to claim 1, wherein the light-emitting device has an emission wavelength of 380 nm to 410 nm.

3. A method for producing a Group III nitride semiconductor light-emitting device according to claim 1, wherein the well layer comprises $In_zGa_{1-z}N$, here $z'=z/100$, $3.1 \leq z \leq 9.2$, and the barrier layer is formed from $Al_xGa_{1-x}N$, here $x'=x/100$ where $23.21-D(\lambda) \leq x \leq 30.71-D(\lambda)$.

4. A method for producing a Group III nitride semiconductor light-emitting device according to claim 2, wherein the well layer is formed from $In_zGa_{1-z}N$, here $z'=z/100$, $3.1 \leq z \leq 9.2$, and the barrier layer is formed from $Al_xGa_{1-x}N$, here $x'=x/100$ where $23.21-D(\lambda) \leq x \leq 30.71-D(\lambda)$.

5. A method for producing a Group III nitride semiconductor light-emitting device according to claim 1, wherein a number of units, each consisting of the well layer and the barrier layer, is 3 to 10.

6. A method for producing a Group III nitride semiconductor light-emitting device according to claim 1, wherein a thickness of said each well layer is adjusted to 2 nm to 4 nm, and a thickness of said each barrier layer is adjusted to 2 nm to 8 nm.

7. A method for producing a Group III nitride semiconductor light-emitting device according to claim 1, wherein 3 to 10 units of the MQW-structure light-emitting layer are provided in the Group III nitride semiconductor light-emitting device.

8. A method for producing a Group III nitride semiconductor light-emitting device according to claim 1, wherein 8 to 10 units of the MQW-structure light-emitting layer are provided in the Group III nitride semiconductor light-emitting device.

9. A method for producing a Group III nitride semiconductor light-emitting device according to claim 1, wherein a thickness of said each well layer is adjusted to 3 nm to 4 nm.

10. A method for producing a Group III nitride semiconductor light-emitting device according to claim 9, wherein a thickness of said each barrier layer is adjusted to 2 nm to 4 nm.

11. A method for producing a Group III nitride semiconductor light-emitting device according to claim 1, wherein the Al compositional ratio in the capping layer of AlGaN is equal to the Al compositional ratio of the barrier layer.

12. A method for producing a Group III nitride semiconductor light-emitting device according to claim 1, further comprising:
    disposing the MQW-structure light-emitting layer on an n-type cladding layer.

13. A method for producing a Group III nitride semiconductor light-emitting device according to claim 12, further comprising:
    disposing a p-type cladding layer on the MQW-structure light-emitting layer.

14. A method for producing a Group III nitride semiconductor light-emitting device according to claim 13, further comprising:
    disposing a p-type contact layer on the p-type cladding layer.

15. A method for producing a Group III nitride semiconductor light-emitting device according to claim 1, further comprising:
    sequentially disposing a p-type contact layer and a p-type cladding layer on the MQW-structure light-emitting layer.

* * * * *